US 6,936,511 B2

(12) United States Patent
Divakaruni et al.

(10) Patent No.: US 6,936,511 B2
(45) Date of Patent: Aug. 30, 2005

(54) INVERTED BURIED STRAP STRUCTURE AND METHOD FOR VERTICAL TRANSISTOR DRAM

(75) Inventors: Ramachandra Divakaruni, Ossining, NY (US); Thomas W. Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/337,014

(22) Filed: Jan. 3, 2003

(65) Prior Publication Data

US 2004/0129942 A1 Jul. 8, 2004

(51) Int. Cl.$^7$ .......................................... H01L 21/8242
(52) U.S. Cl. ....................... 438/242; 438/243; 438/245; 438/270; 438/386

(58) Field of Search ................................ 438/242, 243, 438/259, 270, 245, 386; 257/E27.095, E27.096, E21.652

(56) References Cited

U.S. PATENT DOCUMENTS 6,190,971 B1 * 2/2001 Gruening et al. ............ 438/270
6,586,300 B1 * 7/2003 Hummler et al. ............ 438/242

* cited by examiner

Primary Examiner—George Fourson
Assistant Examiner—Julio J. Maldonado
(74) Attorney, Agent, or Firm—Eric W. Petraske; Steve Capella

(57) ABSTRACT

A simple method of forming the buried strap in a trench DRAM sets the separation between the buried strap and the vertical transistor channel by control of the overetch in forming a recess of the buried strap material, instead of setting the separation by the thickness of the trench top oxide.

15 Claims, 3 Drawing Sheets

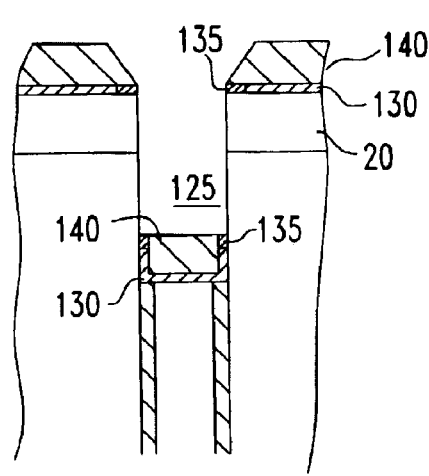
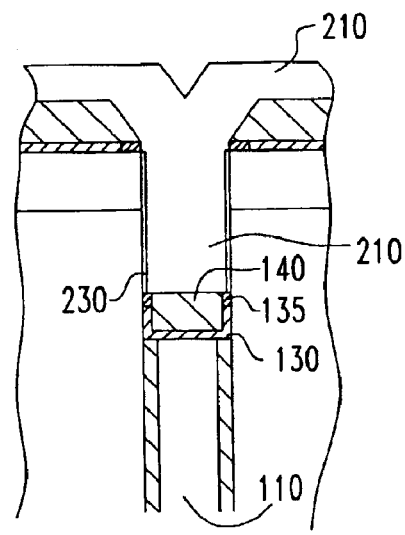
FIG. 4  FIG. 5
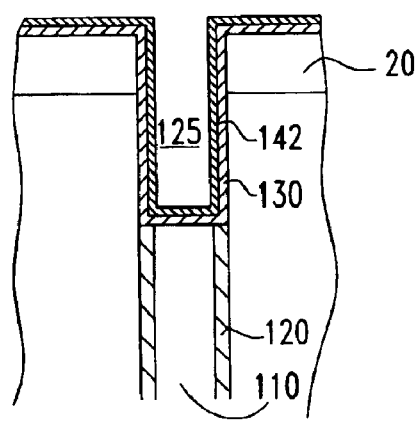
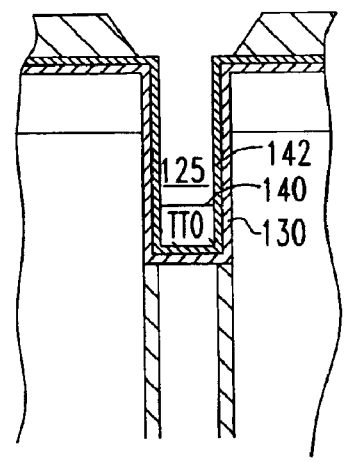
FIG. 6  FIG. 7

INVERTED BURIED STRAP STRUCTURE AND METHOD FOR VERTICAL TRANSISTOR DRAM

TECHNICAL FIELD

The field of the invention is that of DRAM integrated circuits using trench capacitors and having a conductive member called a buried strap connecting the capacitor center electrode to the vertical transistor through a path that passes through the semiconductor substrate.

BACKGROUND OF THE INVENTION

In the fabrication of a trench capacitor DRAM, the capacitor at the bottom of the trench is connected to the lower electrode of the vertical transistor through a diffused area called a buried strap that is typically formed in the single crystal silicon substrate by depositing a doped layer of polycrystalline silicon (poly) and in a heat treatment diffusing the dopant out into the single crystal substrate.

In contemporary practice, the buried strap is formed by opening an aperture in the insulating sidewall of the trench and diffusing dopant into the bulk single-crystal silicon to make a path out of the trench, into the silicon and vertically upward to contact the lower electrode of the vertical transistor.

One problem with this approach is that it requires a large out-diffusion in order to ensure overlap between the strap and the channel of the vertical device. The diffusion from the buried strap must extend vertically sufficiently that the P-N junction between the buried strap and the channel is within the range of control of the transistor gate—i.e. that there is not a length of silicon between the lower electrode of the transistor and the channel that would not be inverted. The overlap must be sufficient to work throughout the range of dimensions that result from processing variations.

The depth and width of the buried strap are limited to the collar oxide thickness and the aspect ratio requirements of the process. If the designer tries to make the buried strap layer too thick, it will block the upper portion of the aperture, leaving a void.

SUMMARY OF THE INVENTION

The invention relates to a process for forming a buried strap in trench DRAM cells that: a) forms a poly liner in the trench before the formation of the trench top oxide and b) opens an aperture at the top corners of the trench top oxide that holds the isolating dielectric that separates the buried strap from the gate.

In an embodiment of the invention a recess is formed adjacent to the trench walls in the buried strap material, creating an opening that exposes a portion of the single crystal substrate.

Another aspect of the invention is a significant reduction in outdiffusion distance in the silicon sidewall above the buried strap.

BRIEF DESCRIPTION OF THE DRAWINGS

FIG. 4 shows the deposition of an insulator plug.

FIG. 5 shows the final structure.

FIG. 6 shows the result of preliminary steps in a second method according to the invention.

FIG. 7 shows the cell of FIG. 6 after deposition of the TTO.

DETAILED DESCRIPTION

Preliminary steps of performing threshold and well implants, etching the DRAM trenches and forming the capacitor are conventional and will be omitted for simplicity in exposition.

Figure 1:
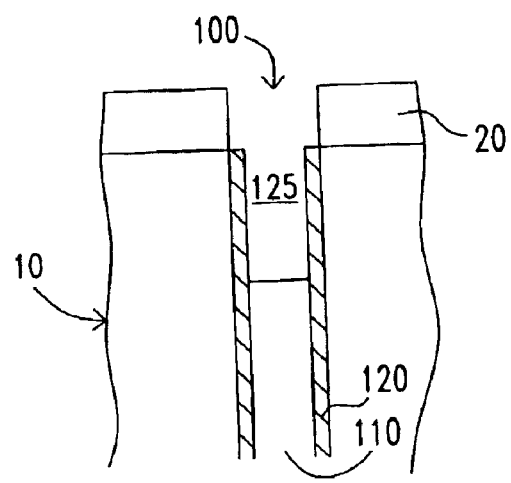
FIG. 1 shows the result of preliminary steps in a first method according to the invention.

FIG. 1 illustrates a sample trench for a DRAM cell after the trench has been etched and the capacitor formed. At the bottom of the Figure, poly 110 is the center electrode of the capacitor of trench 100, with oxide collar 120 as the capacitor insulation. Aperture 125 above poly 110 is the area within which the vertical transistor will be formed. Pad nitride 20 represents the pad nitride and/or oxide that protects the silicon surface. Poly 110 has been recessed in a conventional step to open up the top portion of the trench for the next step in cell formation—forming the buried strap and then forming the transistor. The depth of recess will be referred to as the capacitor depth, marking the boundary between the lower capacitor portion of the cell and the upper portion.

Figure 2:
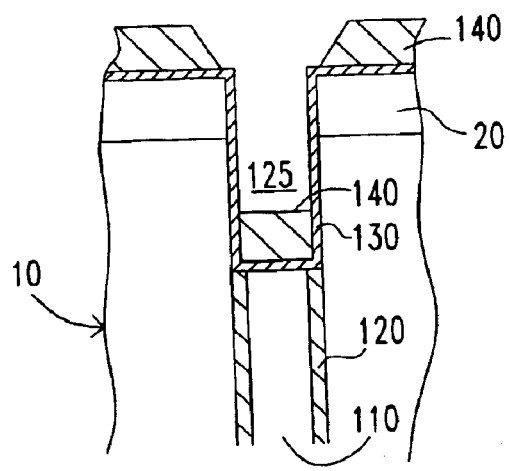
FIG. 2 shows the same cell after stripping the oxide collar and depositing the buried strap layer.

FIG. 2 shows the same area after some intermediate steps of stripping the oxide collar 120 above the capacitor depth in a wet etch and nitriding the exposed silicon surface of the trench walls (0.5 to 1.0 nm of nitride) typically be exposing the trench walls in the presences of a gas that reacts with the exposed silicon to form silicon nitride (Si3N4) and then depositing a buried strap layer of poly 130 that will form the buried strap, illustratively by LPCVD, to a nominal thickness of about 20 nm. Other deposition techniques may be used. The dimension of poly 120 is not critical and those skilled in the art are aware that a thicker layer will not need an extremely high dopant concentration in order to have satisfactory resistivity. Since the poly buried strap is on the path between the bit line and the capacitor electrode, lower resistivity is preferred. Illustratively, the poly liner is intrinsic (i.e. undoped). Outdiffusion from the arsenic doped node polysilicon 110 dopes it in a later step. Alternatively, the poly can be put down doped.

Optionally, a thin oxidation can be performed to protect the buried strap poly 120 during later processing. Next, the trench top oxide (TTO) layer 140, referred to as a separation layer, is deposited by HDP deposition, nominally 100 nm thick. The function of the TTO is to isolate the gate electrode from the capacitor. The TTO can be much thicker than in previous methods because it no longer defines the separation between the buried strap (BS) and the channel. That separation is the vertical distance between the diffusion of the buried strap, which is the lower electrode of the transistor, and the transistor channel. The channel is defined by the gate, which begins at the top surface of the oxide plug separating the buried strap from the transistor. If the separation is too great, there will be less dopant in the path and the resistivity will be greater than its design value.

After the TTO is formed, an oxide strip (side-wall etch) is performed to remove the small amount of HDP oxide deposited on the sidewalls of aperture 132 and prepare that surface for the formation of the transistor.

Figure 3:
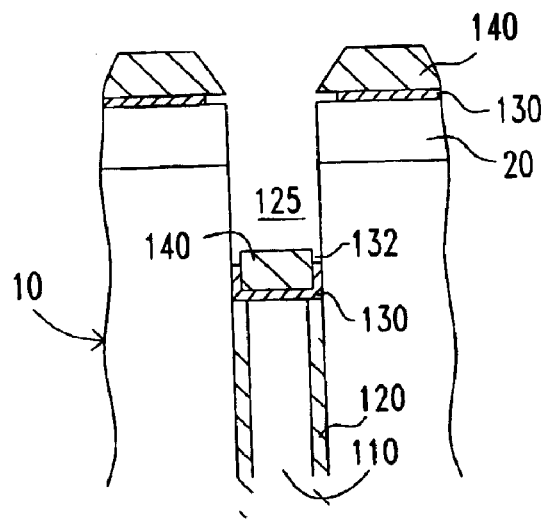
FIG. 3 shows the the result of recessing the polysilicon.

FIG. 3 shows the result of stripping poly 130, after the formation of the TTO, with an overetch such that an aperture 132 is formed at the top corners of TTO 140, thus defining the location of the buried strap as it extends from the top surface of capacitor electrode 110 over to the side and vertically along the sidewalls of the trench. The nominal depth of the aperture is 20 nm.

During this step of stripping buried strap poly from the trench sidewalls, the trench walls themselves are protected by the nitriding step discussed with respect to FIG. 1, so that the silicon surface of the channel is not damaged; i.e. the wet etching of the buried strap poly is highly selective to the nitride interface. Damage would potentially affect the operation of the transistor. In conventional processing of horizontal field effect transistors, the surface of the channel is protected, typically by growing the gate oxide at an early stage and covering it with the gate poly.

FIG. 4 shows the result of the next step, in which a sacrificial oxide is grown in the aperture, including the divot 132 that will isolate the buried strap and a filling layer of oxide 135 is deposited to fill the rest of aperture 132. Preferably, a non-conformal oxide deposition technique is used to reduce the amount of oxide on the trench walls that must be stripped. FIG. 4 shows the result after filling aperture 132 with oxide 135 and then stripping the residual oxide 135 outside the aperture—i.e. along the inner walls of the trench.

The DRAM cell is finished by forming gate insulator 230, illustratively thermal oxide, and poly gate 210. The surface layer of oxide 130 and oxide 140 remain in this example. They could be stripped, but here they provide useful separation from the word line that is the extension of gate poly 210.

The vertical extent of oxide plug 135 defines the separation between the buried strap and the transistor channel. Isolation between gate electrode 210 and the buried strap (connected to capacitor center electrode 110) is provided by the TTO 140 and the oxide plug 135.

FIG. 5 shows the final structure, with gate oxide 230 and gate electrode 210 completing the vertical transistor.

The second embodiment is the same up through the step of depositing buried strap poly 130. A poly liner for the buried strap is deposited as in the previous embodiment. In FIG. 6, a nitride liner 142 is deposited within poly liner 130 before the step of depositing TTO 140. This nitride will provide better insulation between the capacitor and the gate than in other versions of a vertical transistor. The oxide deposited by the HDP process for the TTO layer is not as good an insulator as the nitride, even if it is thicker.

FIG. 7 shows the same area after the deposition and etchback of TTO 140, with the poly and nitride liners forming a tup at the bottom that holds the TTO layer 140.

Figure 8:
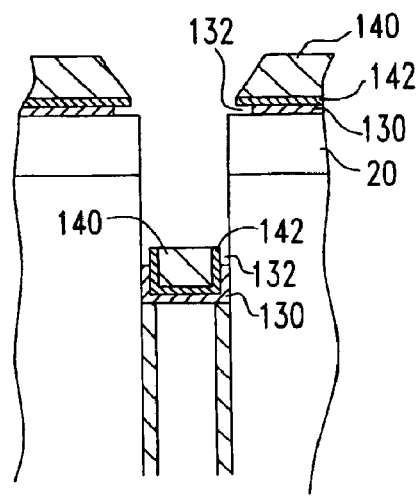
FIG. 8 shows the cell after a recess of the poly liner.

Both liners 142 and 130 are stripped by a nitride strip followed by a poly strip and overetch to form aperture 132, which also appears in the pad layer. The result is shown in FIG. 8, with the single crystal walls exposed. The earlier step of nitriding formed a protective covering of the single crystal walls so that the surface of the channel is not damaged and/or that the phosphorous from the nitride strip or other unwanted dopants do not penetrate the channel, affecting the transistor operation.

Figure 9:
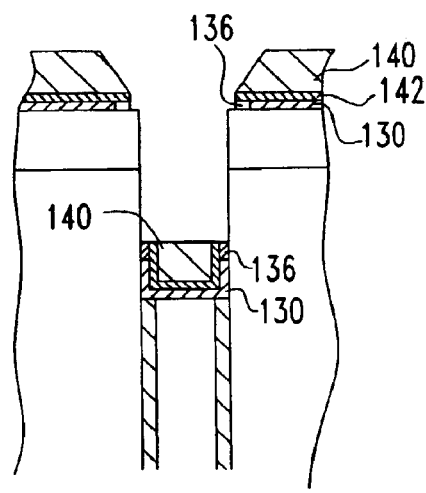
FIG. 9 shows the cell after completion of the insulator separating the buried strap from the gate.

Aperture 132 is filled with nitride 136 in this embodiment, with a nitride etch-back to remove nitride 136 from the trench sidewalls. The result is shown in FIG. 9, with the single crystal walls again exposed. The composition of the top layer of the separation is TTO in the center and a double layer of nitride (142 and 136) on the outer edge. This etch back also removes the nitrided layer from the sidewalls that has protected the surface of the transistor channel.

Figure 10:
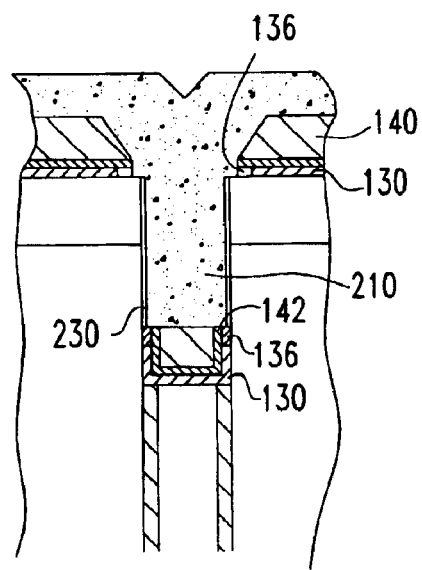
FIG. 10 shows the completed cell in the second embodiment.

FIG. 10 shows the result after a sacrificial thermal oxide is grown and stripped to clean up the sidewalls, after which the gate insulator 230 is formed, illustratively a thermal oxide. The sacrificial oxide removes damage to the surface of the channel, including contaminating dopants from previous steps. Gate electrode 210 completes the transistor.

The two embodiments have in common the feature that the TTO thickness is not critical, since the separation of the buried strap and the channel is implemented by the dielectric plug 135 or 136 in aperture 132. The depth of the aperture and therefore the separation between the strap and the gate is controlled by the overetch in the removal of the buried strap poly layer 130. For example, if the TTO is larger than the design calls for, the depth of the aperture 132 that is formed by the poly overetch is not affected, since it is defined with respect to the top surface of TTO 140. If the buried strap is slightly longer vertically than specified, and therefore if the channel is slightly shorter, the operation of the cell is not significantly affected.

A step of doping through aperture 132 is not necessary because the plug is so small that the buried strap dopant diffuses to cover that distance. The method according to the invention relies on outdiffusion from the arsenic-doped node poly through the buried strap poly and into the active silicon to bridge the gap.

An advantageous feature of the invention is that the thickness of the buried strap is not limited by the thickness of the collar oxide, since the buried strap thickness is not limited by an aperture having the thickness of the collar oxide that was formed by etching a divot in the collar oxide. Thus, the buried strap can be thicker than in prior art versions.

Those skilled in the art will appreciate that the invention can be practiced in bulk silicon wafers or in SOI wafers and in SiGe wafers. In addition, various compatible materials may be substituted for the ones listed, e.g. oxide for nitride and vice versa, including the TTO layer which may be any suitable insulator. While the invention has been described in terms of two preferred embodiments, those skilled in the art will recognize that the invention can be practiced in various versions within the spirit and scope of the following claims.

What is claimed is:

1. A method of forming a DRAM cell in a semiconductor substrate comprising a trench capacitor connected by a buried strap to a vertical transistor comprising the steps of:

etching a trench in said substrate, and forming a capacitor within the trench, the capacitor having a top exposed surface of a central electrode;

depositing a layer of buried strap material as intrinsic polysilicon on the top exposed surface and diffusing dopant from said central electrode through said layer of buried strap material and into said semiconductor substrate;

depositing a center separation layer of insulator within said layer of buried strap conductive material, thereby separating the buried strap from the center of the upper portion of the trench;

recessing the buried strap material to form a recess having a recess depth around said center layer of insulator;

filling said recess with an insulator plug, thereby establishing a separation layer of insulator filling said trench laterally and having a vertical extent equal to said recess depth and thereby separating said central electrode from the upper portion of the trench; and forming a vertical transistor adjacent to said separation layer of insulator.

2. A method according to claim 1, said dopant extends vertically from said buried strap to a top edge of said insulator plug.

3. A method according to claim 2, in which said step of recessing said buried strap material is effected by stripping said buried strap material in a non-directional etch and continuing with an overetch to said recess depth.

4. A method according to claim 1, further comprising the steps of:

forming a dielectric collar in at least the upper portion of the trench;

recessing said central electrode to a capacitor depth;

stripping said collar above said capacitor depth; and forming a protective layer on exposed trench walls above said capacitor depth.

5. A method according to claim 4, in which said step of recessing said buried strap material is effected by stripping said buried strap material in a non-directional etch and continuing with an overetch to a recess depth of about 20 nm.

6. A method of forming a DRAM cell in a semiconductor substrate comprising a trench capacitor connected by a buried strap to a vertical transistor comprising the steps of:

etching a trench in said substrate, and forming a capacitor within the trench, the capacitor having a top exposed surface of a central electrode;

depositing a layer of buried strap material as intrinsic polysilicon on the top exposed surface and diffusing dopant from said central electrode through said layer of buried strap material and into said semiconductor substrate;

depositing a center separation layer of insulator within said layer of buried strap conductive material, thereby separating the buried strap from the center of the upper portion of the trench;

recessing the buried strap material to form a recess having a recess depth around said center layer of insulator;

filling said recess with an insulator plug, thereby establishing a separation layer of insulator filling said trench laterally and having a vertical extent equal to said recess depth and thereby separating said central electrode from the upper portion of the trench; and forming a vertical transistor adjacent to said separation layer of insulator;

further comprising the steps of: forming a dielectric collar in at least the upper portion of the trench; recessing said central electrode to a capacitor depth;

stripping said collar above said capacitor depth; and forming a protective layer on exposed trench walls above said capacitor depth.

7. A method according to claim 6, in which said recess depth is about 20 nm and said separation layer is deposited with a thickness greater than about 100 nm.

8. A method of forming a DRAM cell in a semiconductor substrate comprising a trench capacitor connected by a buried strap to a vertical transistor comprising the steps of:

etching a trench in said substrate, and forming a capacitor within the trench, the capacitor having a top exposed surface of a central electrode;

depositing a layer of buried strap material on the trench walls and on the top exposed surface;

depositing a dielectric liner within said layer of buried strap material;

depositing a center separation layer of insulator within said layer of buried strap material after said step of depositing a dielectric liner within said layer of buried strap material and within the trench, thereby separating the buried strap from the center of the upper portion of the trench;

stripping said dielectric liner and said buried strap layer above said separation layer;

recessing the buried strap material to form a recess having a recess depth around said center layer of insulator and between said center layer of insulator and said trench walls;

filling said recess with an insulator plug of the same material as said dielectric liner, thereby establishing a separation layer of insulator formed from both said center separation layer of insulator and said insulator plug filling said trench laterally and having a vertical extent equal to said recess depth and thereby separating said central electrode from the upper portion of the trench; and forming a vertical transistor in said DRAM cell having a gate within said trench and above said separation layer of insulator.

9. A method according to claim 8, further comprising the steps of:

diffusing dopant into said substrate, said dopant extending vertically from said buried strap to a top edge of said insulator plug.

10. A method according to claim 8, further comprising the steps of:

forming a dielectric collar in at least the upper portion of the trench;

recessing said central electrode to a capacitor depth;

stripping said collar above said capacitor depth; and forming a protective layer on exposed trench walls above said capacitor depth.

11. A method according to claim 9, in which said step of recessing said buried strap material is effected by stripping said buried strap material in a non-directional etch and continuing with an overetch to said recess depth.

12. A method according to claim 10, in which said step of recessing said buried strap material is effected by stripping said buried strap material in a non-directional etch and continuing with an overetch to a recess depth of about 20 nm.

13. A method according to claim 11, in which said step of recessing said buried strap material is effected by stripping said buried strap material in a non-directional etch and continuing with an overetch to a recess depth of about 20 nm.

14. A method of forming a DRAM cell in a semiconductor substrate comprising a trench capacitor connected by a buried strap to a vertical transistor comprising the steps of:

etching a trench in said substrate, and forming a capacitor within the trench, the capacitor having a top exposed surface of a central electrode;

depositing a layer of buried strap material on the trench walls and on the top exposed surface;

depositing a dielectric liner within said layer of buried strap material;

depositing a center separation layer of insulator within said layer of buried strap conductive material after said step of depositing a dielectric liner within said layer of buried strap material, thereby separating the buried strap from the center of the upper portion of the trench;

stripping said dielectric liner and said buried strap layer above said separation layer;

recessing the buried strap material to form a recess having a recess depth around said center layer of insulator;

filling said recess with an insulator plug of the same material as said dielectric liner, thereby establishing a separation layer of insulator filling said trench laterally and having a vertical extent equal to said recess depth and thereby separating said central electrode from the upper portion of the trench; and forming a vertical transistor adjacent to said separation layer of insulator in which a step of diffusing dopant into said substrate, said dopant extending vertically from said buried strap to a top edge of said insulator plug is effected by:

depositing said layer of buried strap material as intrinsic polysilicon; and diffusing dopant from said central electrode through said layer of buried strap material and into said semiconductor substrate.

15. A method of forming a DRAM cell in a semiconductor substrate comprising a trench capacitor connected by a buried strap to a vertical transistor comprising the steps of:

etching a trench in said substrate, and forming a capacitor within the trench, the capacitor having a top exposed surface of a central electrode;

depositing a layer of buried strap material on the trench walls and on the top exposed surface;

depositing a dielectric liner within said layer of buried strap material;

depositing a center separation layer of insulator within said layer of buried strap conductive material after said step of depositing a dielectric liner within said layer of buried strap material, thereby separating the buried strap from the center of the upper portion of the trench;

stripping said dielectric liner and said buried strap layer above said separation layer;

recessing the buried strap material to form a recess having a recess depth around said center layer of insulator;

filling said recess with an insulator plug of the same material as said dielectric liner, thereby establishing a separation layer of insulator filling said trench laterally and having a vertical extent equal to said recess depth and thereby separating said central electrode from the upper portion of the trench; and forming a vertical transistor adjacent to said separation layer of insulator in which a step of diffusing dopant into said substrate, said dopant extending vertically from said buried strap to a top edge of said insulator plug is effected by:

depositing said layer of buried strap material as intrinsic polysilicon; and diffusing dopant from said central electrode through said layer of buried strap material and into said semiconductor substrate.

* * * * *